(12) United States Patent
Domae et al.

(10) Patent No.: US 7,298,657 B2
(45) Date of Patent: Nov. 20, 2007

(54) FERROELECTRIC RANDOM ACCESS MEMORY

(75) Inventors: Sumiko Domae, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 11/347,337

(22) Filed: Feb. 6, 2006

(65) Prior Publication Data

US 2007/0047341 A1     Mar. 1, 2007

(30) Foreign Application Priority Data

Aug. 31, 2005   (JP)   ............................. 2005-252358

(51) Int. Cl.
   *G11C 29/00*   (2006.01)
(52) U.S. Cl. ........................... 365/200; 365/145
(58) Field of Classification Search ................ 365/200, 365/145
   See application file for complete search history.

(56) References Cited

U.S. PATENT DOCUMENTS 6,507,510 B2 *   1/2003   Takashima .................. 365/145
6,879,529 B2 *   4/2005   Yamada ...................... 365/200
2002/0186600 A1* 12/2002   Kang et al. ................. 365/200

FOREIGN PATENT DOCUMENTS

| JP | 6-203594   | 7/1994 |
| JP | 10-255483  | 9/1998 |
| JP | 11-177036  | 7/1999 |
| JP | 2000-22010 | 1/2000 |
| JP | 2002-50192 | 2/2002 |

\* cited by examiner

*Primary Examiner*—Anh Phung
(74) *Attorney, Agent, or Firm*—Oblon, Spivak, McClelland, Maier & Neustadt, P.C.

(57) ABSTRACT

A unit cell is composed of a memory cell transistor and a ferroelectric storage element connected in parallel between a source and a drain of the memory cell transistor. A memory cell block is composed of a plurality of unit cells connected in series. One end of the memory cell block is connected to a bit line via a block selecting transistor. The other end of the memory cell block is connected to a plate line. A redundancy unit cell is composed of a redundancy cell transistor and a ferroelectric storage element connected in parallel between a source and a drain of the redundancy cell transistor. A redundancy memory cell block is composed of a plurality of unit cells connected in series, the number of which is smaller than that of the unit cells in the memory cell block.

20 Claims, 6 Drawing Sheets

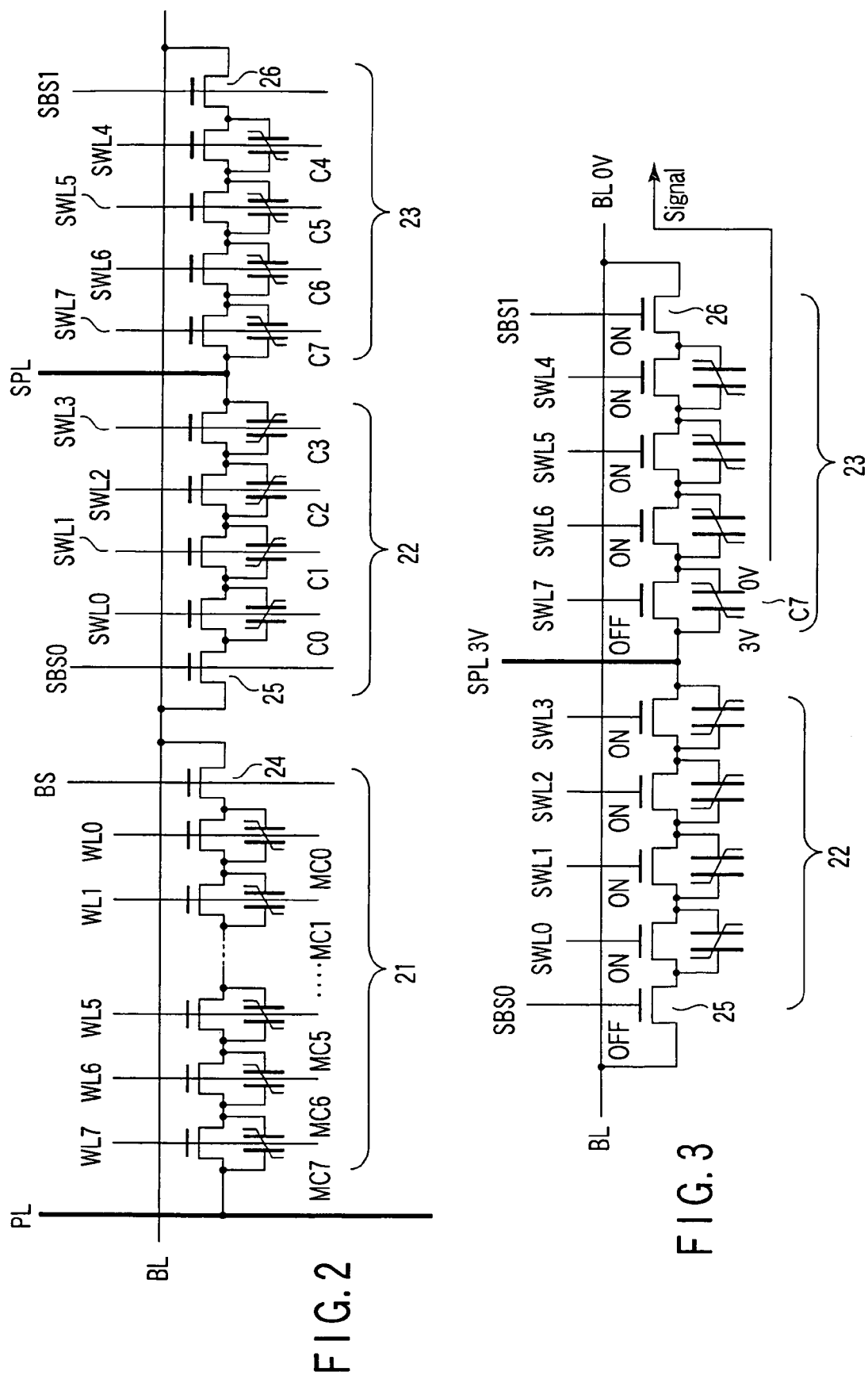

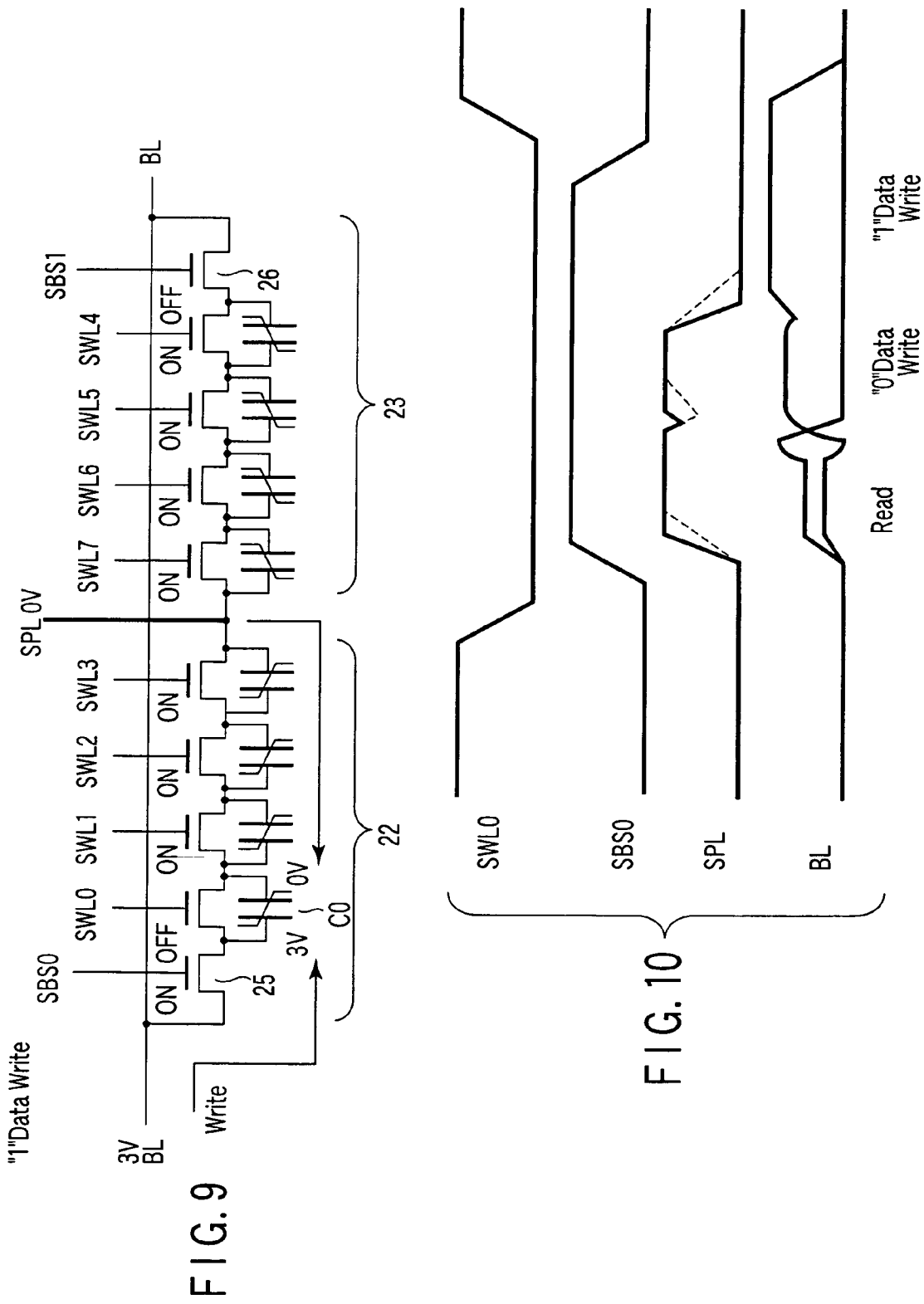

FERROELECTRIC RANDOM ACCESS MEMORY

CROSS-REFERENCE TO RELATED APPLICATIONS

This application is based upon and claims the benefit of priority from prior Japanese Patent Application No. 2005-252358, filed Aug. 31, 2005, the entire contents of which are incorporated herein by reference.

BACKGROUND OF THE INVENTION

1. Field of the Invention

The present invention relates to a ferroelectric random access memory using a ferroelectric capacitor, and in particular, to a ferroelectric random access memory having a remedial redundancy function.

2. Description of the Related Art

Ferroelectric random access memories (FeRAMs) using a ferroelectric capacitor are known as nonvolatile semiconductor storage devices. Chain FeRAMs (TMs) are also known, as disclosed in Jpn. Pat. Appln. KOKAI Publication Nos. 10-255483, 11-177036, and 2000-22010. In the chain FeRAM, a cell transistor and a ferroelectric capacitor are arranged in parallel to constitute one unit cell. Moreover, a plurality of unit cells is connected in series to constitute a memory cell block. The chain FeRAM serves to realize small-sized memory cells, planar transistors that are easy to manufacture, and a general-purpose high-speed random access function.

For the chain FeRAM, it is important to acquire a chip with a large signal amount in order to ensure reliability. To obtain a sufficient signal amount, it is effective to operate the memory using a pulse signal with a somewhat large pulse widely. When a large number of unit cells are connected in series in a memory cell block, a longer time is required to apply a desired potential to the cells. This affects the signal amount, preventing an increase in operating speed.

On the other hand, semiconductor storage devices generally have a remedial redundancy function. With this function, when any of the main cells are defected, the defected cell is replaced with a redundancy cell to improve yield. The chain FeRAM also has a redundancy memory cell block to provide a remedial redundancy function.

However, a redundancy region in which the redundancy memory cell block is formed is normally located at an end of a cell array. The location at the cell array end may degrade the characteristics of the unit cells in the redundancy memory cell block compared to those of main unit cells that have not been replaced. When the unit cells in the redundancy memory cell block have bad characteristics, remedy efficiency may decrease.

Further, even with successful remedy, the use of the redundancy region may degrade the capabilities of the chip. In a conventional chain FeRAM disclosed in, for example, FIG. 40 of Jpn. Pat. Appln. KOKAI Publication No. 10-255483, as many unit cells as those connected in series in a main memory cell block are connected in series in a redundancy memory cell block. One end of the redundancy memory cell block is connected to a bit line via a block selecting transistor. The other end is connected to a spare plate line.

In the chain FeRAM, when data is read from a selected unit cell, the corresponding bit line is set to a low potential, for example, zero. The corresponding plate line is boosted from the low potential to a high potential, for example, 3 V.

On the other hand, when data is written to a selected unit cell, then one of the corresponding bit and plate lines is set to a low potential, for example, zero depending on the write data. The other is set to a high potential, for example, 3 V.

When data is read from one of a plurality of unit cells in a redundancy memory cell block which is located furthest from the corresponding bit line, the polarization state of the selected cell is read to the bit line via a large number of cell transistors. This reduces the speed at which signals are read from the selected cell. On the other hand, when data, particularly "1" data, is written to the unit cell located furthest from the bit line, a potential of 3 V applied to the bit line is transmitted to the selected cell via a large number of cell transistors. This reduces the time for which the write potential is applied to a ferroelectric capacitor in the selected cell. The write operation is thus insufficient.

When data is read from the unit cell located furthest from the plate line, a potential of 3 V applied to the plate line is transmitted to the selected cell via a large number of cell transistors. This also reduces the speed at which signals are read from the selected cell. On the other hand, when data is written to the unit cell located furthest from the plate line, writing "0" data involves transmitting a potential of zero applied to the plate line to the selected cell via a large number of cell transistors. This reduces the time for which the write potential is applied to the ferroelectric capacitor in the selected cell. Writing "1" data involves transmitting a potential of 3 V applied to the plate line to the selected cell via a large number of cell transistors. This reduces the time for which the write potential is applied to the ferroelectric capacitor in the selected cell. That is, when data is written to the unit cell located furthest from the plate line, the write operation is insufficient for both "0" and "1" data.

Jpn. Pat. Appln. KOKAI Publication No. 6-203594 discloses a static RAM having a redundancy function that enables a replacement unit to be set for a redundancy memory part.

BRIEF SUMMARY OF THE INVENTION

According to an aspect of the present invention, there is provided a ferroelectric random access memory comprising a memory cell block which includes a plurality of unit cells connected in series and each composed of a memory cell transistor having a source and a drain and a ferroelectric storage element connected in parallel between the source and drain of the memory cell transistor, the memory cell block being connected between a bit line and a plate line via a block selecting transistor, and a redundancy memory cell block which includes a plurality of unit cells the number of which is smaller than that of the unit cells in the memory cell block, the unit cells being connected in series and each composed of a redundancy cell transistor having a source and a drain and a ferroelectric storage element connected in parallel between the source and drain of the redundancy cell transistor, the redundancy memory cell block being connected between the bit line and a spare plate line via a spare block selecting transistor, the redundancy memory cell block being used in place of the memory cell block when any of the unit cells in the memory cell block is defected.

BRIEF DESCRIPTION OF THE SEVERAL VIEWS OF THE DRAWING

FIG. 2 is a circuit diagram showing a detailed configuration of a part of FIG. 1;

FIG. 3 is a circuit diagram illustrating an operation performed to read data from a unit cell in one of the redundancy memory cell blocks in the circuit shown in FIG. 2;

FIG. 9 is a circuit diagram illustrating an operation performed to write "1" data to a unit cell in the redundancy memory cell block in the circuit shown in FIG. 2;

FIG. 10 is a waveform diagram of the operations in FIGS. 7, 8, and 9; and

DETAILED DESCRIPTION OF THE INVENTION

Embodiments of the present invention will be described below with reference to the drawings.

First Embodiment

Figure 1:
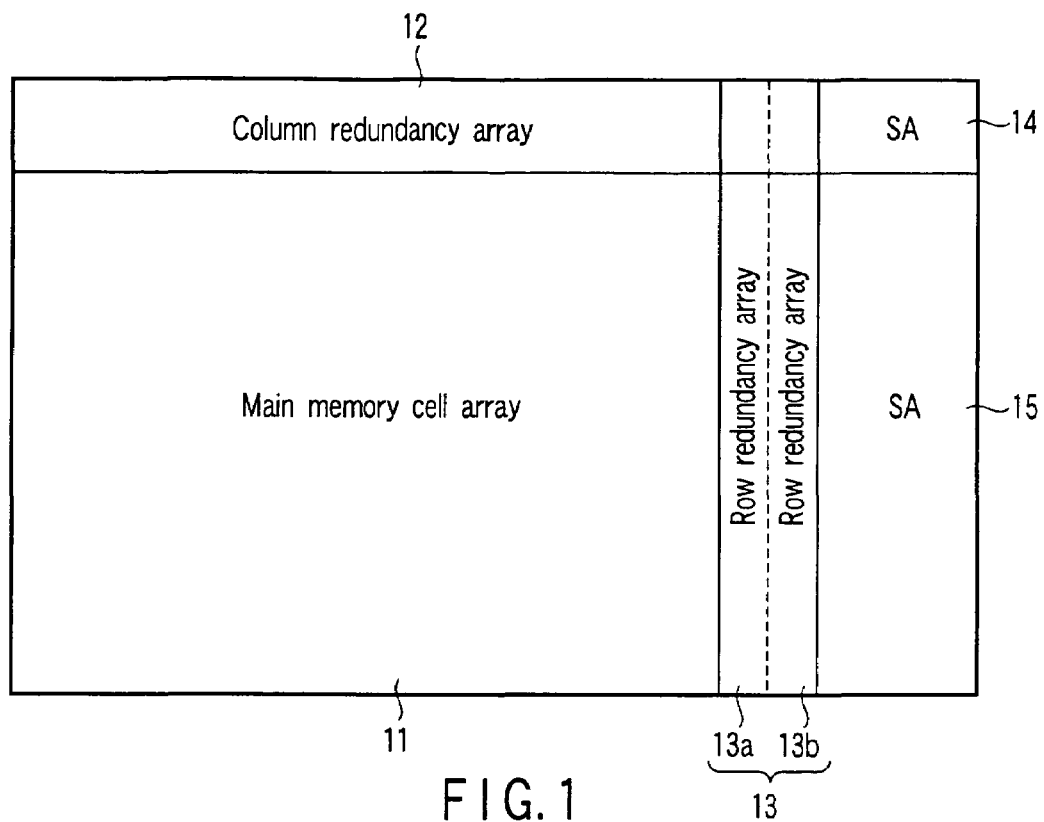
FIG. 1 is a block diagram showing the configuration of interior of a chain FeRAM in accordance with a first embodiment.

FIG. 1 shows the configuration of interior of a chain FeRAM chip in accordance with a first embodiment of the present invention. A plurality of unit cells is provided in a main memory cell array 11. Each of the unit cells is composed of a memory cell transistor and a ferroelectric capacitor connected in parallel. A memory cell block is constituted by connecting n (a positive integer) unit cells together in series. A plurality of memory cell blocks is arranged in a matrix. A column redundancy array 12 is placed at an end of the main memory cell array 11 across the columns; when any of the unit cells in the main memory cell array 11 is defected, the column containing the unit cell is replaced with one from the column redundancy array 12. A row redundancy array 13 is placed at an end of the main memory cell array 11 across the rows; when any of the unit cells in the main memory cell array 11 is defected, the row containing the unit cell is replaced with one from the row redundancy array 13. Moreover, a column redundancy sense amplifier circuit (SA) 14 is placed adjacent to the column redundancy array 12. A sense amplifier circuit (SA) 15 is placed adjacent to the row redundancy array 13.

When each memory cell block in the main memory cell array 11 is composed of, for example, eight (n=8) unit cells, the row redundancy array 13 contains two types of row redundancy arrays consisting of first and second row redundancy arrays 13a and 13b each provided with a row redundancy memory cell block composed of four unit cells; the number of unit cells is half of eight.

FIG. 2 shows a detailed configuration of one memory cell block 21 in the memory cell array 11 in FIG. 1 which cell block is located closest to the row redundancy array 13, one redundancy memory cell block 22 in the first row redundancy array 13a, and one redundancy memory cell block 23 in the second row redundancy array 13b. In an actual chip, a large number of memory cell blocks are arranged to the left of the memory cell block 21 but are not shown in FIG. 1.

The memory cell block 21 contains eight unit cells MC0 to MC7 connected in series. Each of the unit cells is composed of a memory cell transistor having a source and a drain and a ferroelectric capacitor connected in parallel between the source and drain of the memory cell transistor. One end of the memory cell block 21 is connected to a bit line BL via a block selecting transistor 24. The other end is connected to a plate line PL.

The redundancy memory cell block 22 contains four spare unit cells C0 to C3 connected in series. Each of the spare unit cells is composed of a redundancy cell transistor having a source and a drain and a ferroelectric capacitor connected in parallel between the source and drain of the redundancy cell transistor. One end of the redundancy memory cell block 22 is connected to the bit line BL via a block selecting transistor 25. The other end is connected to a spare plate line SPL.

The redundancy memory cell block 23 contains four spare unit cells C4 to C7 connected in series. Each of the spare unit cells is composed of a redundancy cell transistor having a source and a drain and a ferroelectric capacitor connected in parallel between the source and drain of the redundancy cell transistor. One end of the redundancy memory cell block 23 is connected to the bit line BL via a block selecting transistor 26. The other end is connected to the spare plate line SPL.

That is, the redundancy memory cell block 22 or 23 contains the spare unit cells C0 to C3 or C4 to C7, the number of which is smaller than that of the unit cells in the memory cell block 21; each of the spare unit cells is composed of the redundancy cell transistor having the source and the drain and the ferroelectric capacitor connected in parallel between the source and drain of the redundancy cell transistor.

In the memory cell block 21, n, in the present example, eight word lines WL0 to WL7 are extended across the rows. The eight word lines WL0 to WL7 are connected to gate electrodes of the cell transistors in the eight unit cells MC0 to MC7, respectively. Moreover, in the memory cell block 21, one block selecting line BS is extended across the rows. The block selecting line BS is connected to a gate electrode of the block selecting transistor 24.

In the redundancy memory cell block 22, (n/2), in the present example, four spare word lines SWL0 to SWL3 are extended across the rows. The four spare word lines SWL0 to SWL3 are connected to gate electrodes of the cell transistors in the four unit cells C0 to C3, respectively. Moreover, in the redundancy memory cell block 22, one spare block selecting line SBS0 is extended across the rows. The spare block selecting line SBS0 is connected to a gate electrode of the block selecting transistor 25.

In the redundancy memory cell block 23, (n/2), in the present example, four spare word lines SWL4 to SWL7 are extended across the rows. The four spare word lines SWL4 to SWL7 are connected to gate electrodes of the cell transistors in the four unit cells C4 to C7, respectively. Moreover, in the redundancy memory cell block 23, one spare block selecting line SBS1 is extended across the rows.

The spare block selecting line SBS1 is connected to a gate electrode of the block selecting transistor 26.

In the chain FeRAM configured as described above, when any of the unit cells in the memory cell block 21 is defected, the memory cell block 21 is replaced with the redundancy memory cell block 22 or 23, consisting of the four unit cells. If, for example, any one or more of the four unit cells MC0 to MC3 in the memory cell block 21 are defected, the four unit cells MC0 to MC3 are replaced with the four unit cells C0 to C3 in the redundancy memory cell block 22. If any one or more of the four unit cells MC4 to MC7 in the memory cell block 21 are defected, the four unit cells MC4 to replaced with the four unit cells C4 to C7 in the redundancy memory cell block 23.

When the memory cell block 21 has been replaced with the redundancy memory cell block 22 or 23, then during a data read or write operation, the spare block selecting line SBS0 or SBS1 is selected instead of the block selecting line BS to select the redundancy memory cell block 22 or 23. Moreover, the spare word lines SWL0 to SWL3 or SWL4 to SW7 are selectively driven to select one unit cell in the redundancy memory cell block 22 or 23. Then, data is read from or written to the selected cell.

It is assumed that the unit cell MC7 is accessed when the four unit cells MC4 to MC7 in the memory cell block 21 have been replaced with the redundancy memory cell block 23. In this case, since the four unit cells MC4 to MC7 in the memory cell block 21 have been replaced with the redundancy memory cell block 23, when the unit cell MC7 is accessed, a redundancy control circuit (not shown), for example, an address comparing circuit, a spare row decoder circuit, or a block selecting circuit accesses the unit cell C7 in the redundancy memory cell block 23 instead of the unit cell MC7.

The unit cell C7 corresponds to a spare unit cell in a redundancy memory cell block of a conventional chain FeRAM which is located furthest from the corresponding bit line.

Now, with reference to the circuit diagram in FIG. 3 and the waveform diagram in FIG. 6, description will be given of a data read operation of reading data from the unit cell C7.

Figure 6:
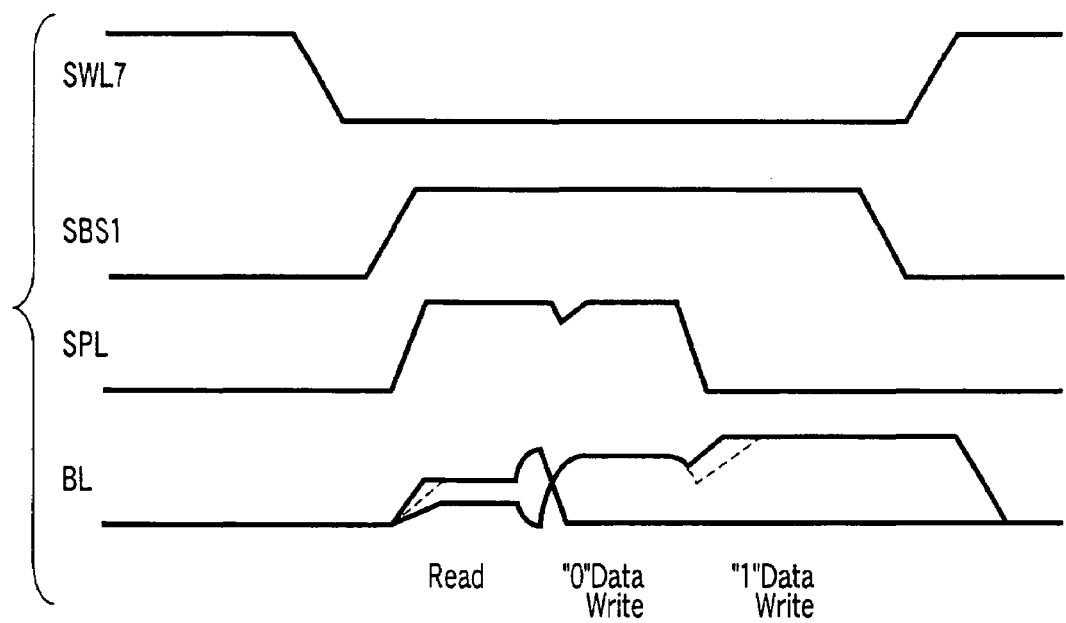
FIG. 6 is a waveform diagram of the operations in FIGS. 3, 4, and 5.

To access the unit cell C7, the space row decoder circuit raises the voltage across only one of the four spare word lines SWL4 to SWL7, the spare word line SWL7, from a high potential to a low potential, for example, 3 to 0 V, while driving the remaining three spare word lines to a high potential, for example, 3 V, as shown in FIG. 6. Moreover, the block selecting circuit drives the spare block selecting line SBS1 to a high potential, for example, 3 V, to turn on the block selecting transistor 26 in the redundancy memory cell block 23.

To read data, the spare plate line SPL is subsequently boosted from a low potential to a high potential, for example, from 0 to 3 V, as shown in FIG. 6. To read data, the bit line BL is set to a low potential, for example, zero.

For the other redundancy memory cell block 22, as shown in FIG. 3, the block selecting transistor 25 is turned off, with all the redundancy cell transistors in the four unit cells turned on.

The spare plate line SPL is boosted to 3 V to read the polarization state of the ferroelectric capacitor in the selected cell C7 to the bit line BL via the four transistors consisting of the three cell transistors and the one block selecting transistor 26. In the prior art, the signal potential is read to the bit line BL via eight transistors consisting of seven cell transistors and one block selecting transistor. That is, the present invention reads the signal potential to the bit line BL via fewer transistors than the prior art. Thus, even if the unit cells in the redundancy memory cell blocks have bad characteristics, specifically the redundancy cell transistors in the unit cells have increased on resistance values, the bit line BL potential can rise faster, as shown by a solid line in FIG. 6, than in a conventional case shown by a broken line. In the redundancy memory cell block 23, selection of the unit cell C7 is the worst condition for a data read operation. Thus, when data is read from a unit cell in the redundancy memory cell block 23 which is different from the unit cell C7, the signal potential is read to the bit line BL faster than with the unit cell C7.

Thus, when the data is read from the unit cell C7, located furthest from the bit line BL, the polarization state of the selected cell is read to the bit line BL via fewer transistors than in the prior art. This increases the speed at which signals are read from the selected cell.

Now, with reference to the circuit diagrams in FIGS. 4 and 5 and the waveform diagram in FIG. 6, description will be given of a data write operation of writing data to the selected unit cell C7.

Figure 4:
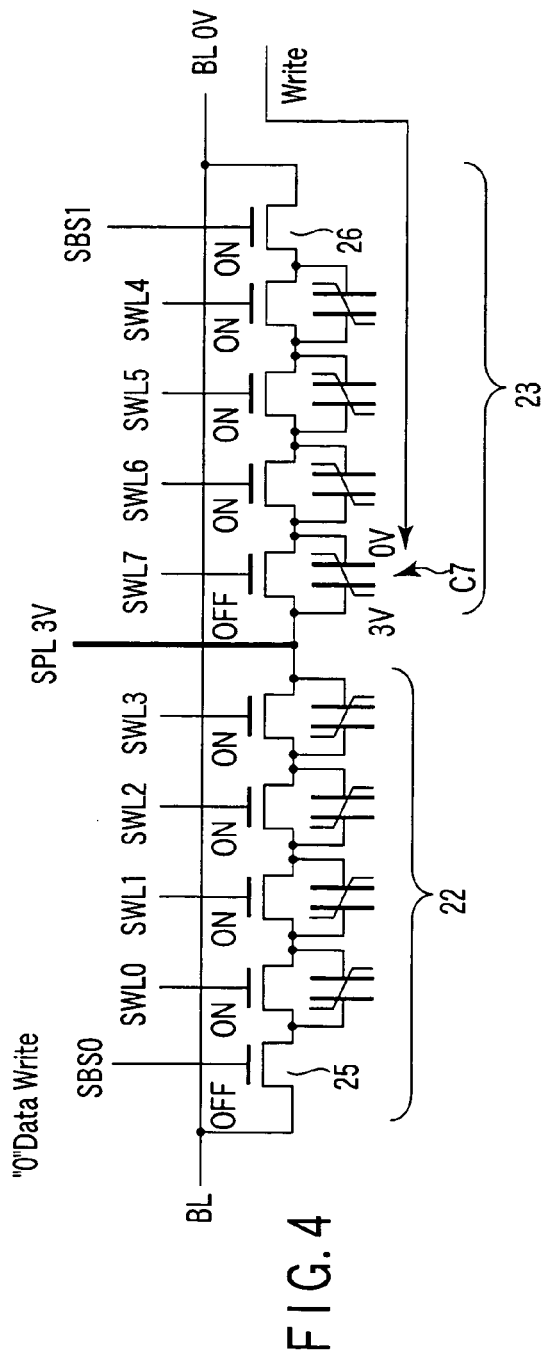
FIG. 4 is a circuit diagram illustrating an operation performed to write "0" data to a unit cell in one of the redundancy memory cell blocks in the circuit shown in FIG. 2.

FIG. 4 is a circuit diagram illustrating an operation performed to write "0" data to the selected unit cell C7. To write "0" data, the spare plate line SPL is boosted from a low potential to a high potential as shown in FIG. 6. The bit line is set to a low potential, for example, zero.

For the other redundancy memory cell block 22, as shown in FIG. 4, the block selecting transistor 25 is turned off, with all the redundancy cell transistors in the four unit cells turned on.

To write "0" data, the low potential across the bit line BL is supplied to the selected unit cell C7 to invert the polarization state of the unit cell C7 compared to that observed before the write operation.

Figure 5:
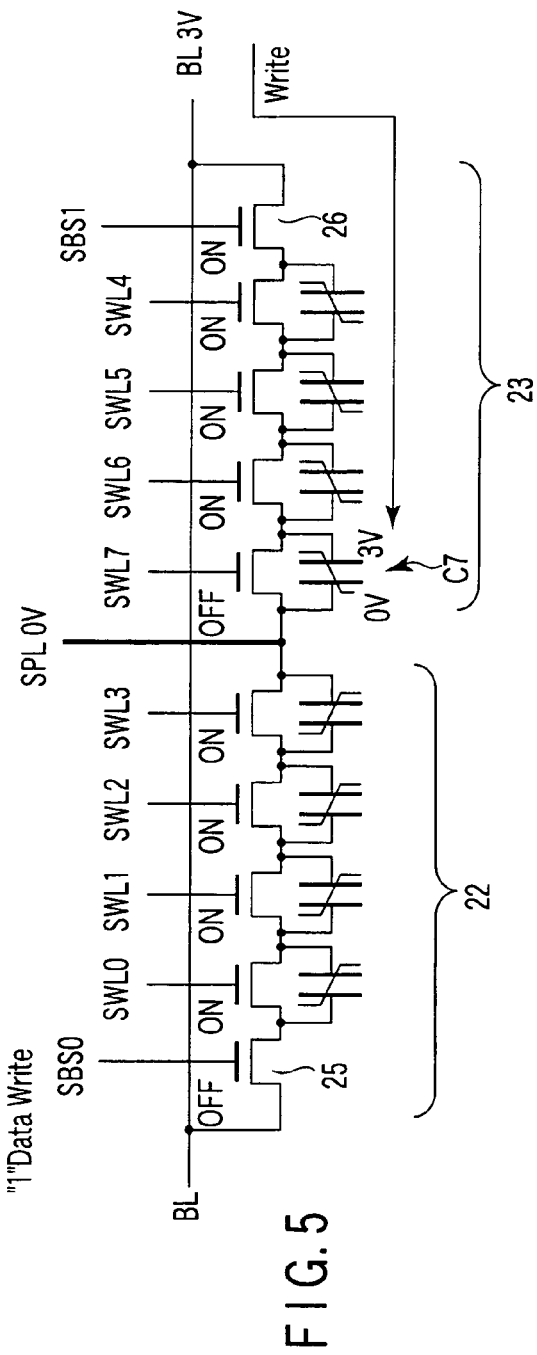
FIG. 5 is a circuit diagram illustrating an operation performed to write "1" data to a unit cell in one of the redundancy memory cell blocks in the circuit shown in FIG. 2.

FIG. 5 is a circuit diagram illustrating an operation performed to write "1" data to the selected unit cell C7. To write "1" data, the voltage across the spare plate line SPL is reduced from the high voltage to the low voltage as shown in FIG. 6. The voltage across the bit line BL is raised to the high potential.

The voltage across the bit line BL is raised to the high potential and applied to the ferroelectric capacitor in the unit cell C7 via the four transistors consisting of the one block selecting transistor 26 and the three redundancy transistors. In the prior art, the potential across the bit line is applied to the selected cell via eight transistors consisting of one block selecting transistor and seven redundancy cell transistors. That is, the first embodiment applies the potential across the bit line BL to the selected cell via fewer transistors than the prior art. Thus, even if the unit cells in the redundancy memory cell blocks have bad characteristics, specifically the redundancy cell transistors in the unit cells have increased on-resistance values, the potential across the bit line BL is applied to the selected cell fast. Consequently, the potential across the bit line BL rises faster, as shown by a solid line in FIG. 6, than in a conventional case shown by a broken line. This increases the time for which the write voltage is applied to the ferroelectric capacitor in the selected unit cell C7 compared to that in the prior art. As a result, the "1" data can be sufficiently written.

Thus, when "1" data is written to the unit cell C7, located furthest from the bit line BL, the potential across the bit line BL is applied to the unit cell C7 fast. This increases the time for which the write voltage is applied to the ferroelectric capacitor in the selected unit cell C7, resulting in a sufficient write operation.

Now, it is assumed that that the unit cell MC0 is accessed when the four unit cells MC0 to MC3 in the memory cell block 21 have been replaced with the redundancy memory cell block 22. In this case, since the four unit cells MC0 to MC3 in the memory cell block 21 have been replaced with the redundancy memory cell block 22, when the unit cell MC0 is accessed, a redundancy control circuit (not shown), for example, an address comparing circuit, a spare row decoder circuit, or a block selecting circuit accesses the unit cell C0 in the redundancy memory cell block 22 instead of the unit cell MC0.

The unit cell C0 corresponds to a spare unit cell in a redundancy memory cell block of a conventional chain FeRAM which is located furthest from the corresponding spare unit line.

Now, with reference to the circuit diagram in FIG. 7 and the waveform diagram in FIG. 10, description will be given of a data read operation of reading data from the unit cell C0.

To access the unit cell C0, the space row decoder circuit raises the voltage across only one of the four spare word lines SWL0 to SWL3, the spare word line SWL0, from a high potential to a low potential, for example, 3 to 0 V, while driving the remaining three spare word lines to a high potential, for example, 3 V, as shown in FIG. 10. Moreover, the block selecting circuit drives the spare block selecting line SBS0 to a high potential, for example, 3 V, to turn on the block selecting transistor 25 in the redundancy memory cell block 22.

To read data, the spare plate line SPL is subsequently boosted from a low potential to a high potential, for example, from 0 to 3 V, as shown in FIG. 10. To read data, the bit line BL is set to a low potential, for example, zero.

Figures 7, 8:
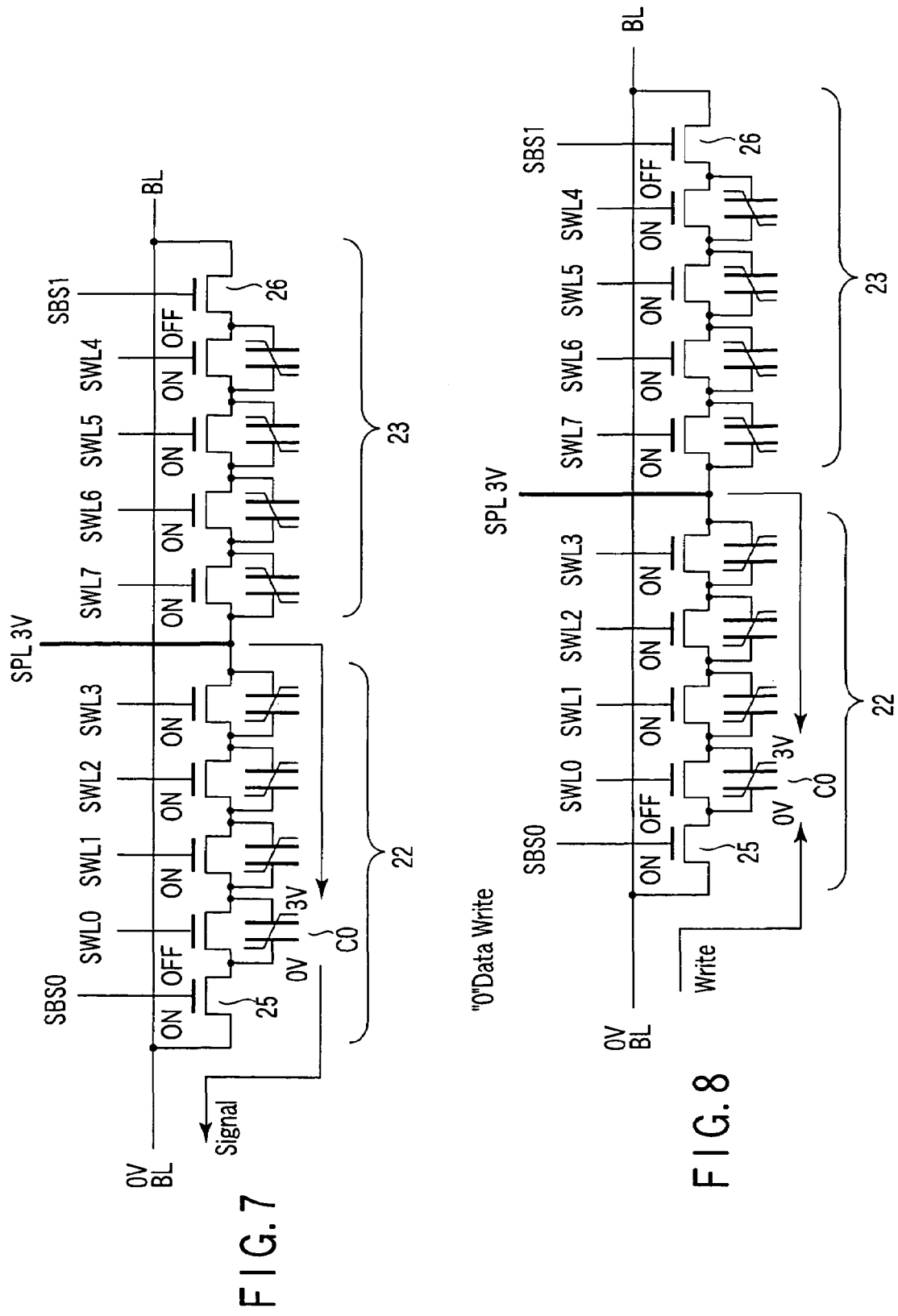
FIG. 7 is a circuit diagram illustrating an operation performed to read data from a unit cell in the other redundancy memory cell block in the circuit shown in FIG. 2.
FIG. 8 is a circuit diagram illustrating an operation performed to write "0" data to a unit cell in the other redundancy memory cell block in the circuit shown in FIG. 2.

For the other redundancy memory cell block 23, as shown in FIG. 7, the block selecting transistor 26 is turned off, with all the redundancy cell transistors in the four unit cells turned on.

The spare plate line SPL is boosted to 3 V to transmit the potential across the spare plate line SPL to the selected cell C0 via the three redundancy cell transistors. In the prior art, the potential across the spare plate line is transmitted to the selected cell via seven redundancy cell transistors. That is, the first embodiment transmits potential across the spare plate line SPL to the selected cell C0 via fewer transistors than the prior art. Thus, even if the unit cells in the redundancy memory cell block have bad characteristics, specifically the redundancy cell transistors in the unit cells have increased on-resistance values, the potential across the spare plate line SPL can be transmitted to the selected cell C0 fast. Consequently, the potential across the spare plate line SPL can rise faster, as shown by a solid line in FIG. 10, than in a conventional case shown by a broken line. In the redundancy memory cell block 22, selection of the unit cell C0 is the worst condition for a data read operation. Thus, when data is read from a unit cell in the redundancy memory cell block 22 which is different from the unit cell C0, the potential across the spare plate line SPL rises faster than with the unit cell C0. This enables the data to be read faster.

Thus, when the data is read from the unit cell C0, located furthest from the spare plate line SPL, the potential across the spare plate line SPL is transmitted to the selected cell fast. This increases the speed at which signals are read from the selected cell.

Now, with reference to the circuit diagrams in FIGS. 8 and 9 and the waveform diagram in FIG. 10, description will be given of a data write operation of writing data to the selected unit cell C0.

FIG. 8 is a circuit diagram illustrating an operation performed to write "0" data to the selected unit cell C0. To write "0" data, the spare plate line SPL is boosted from a low potential to a high potential as shown in FIG. 10. The bit line is set to a low potential, for example, zero.

For the other redundancy memory cell block 23, as shown in FIG. 8, the block selecting transistor 26 is turned off, with all the redundancy cell transistors in the four unit cells turned on.

To write "0" data, the high potential across the spare plate line SPL is applied to the ferroelectric capacitor in the selected cell C0 via three redundancy cell transistors. In the prior art, the potential across the spare plate line is applied to the selected cell via seven redundancy cell transistors. That is, the first embodiment applies the potential across the spare plate line SPL to the selected cell via fewer transistors than the prior art. Thus, even if the unit cells in the redundancy memory cell block have bad characteristics, specifically the redundancy cell transistors in the unit cells have increased on resistance values, the potential across the spare plate line SPL is applied to the selected cell fast. Consequently, the potential across the spare plate line SPL rises faster, as shown by a solid line in FIG. 10, than in a conventional case shown by a broken line. This increases the time for which the write voltage is applied to the ferroelectric capacitor in the selected unit cell C0 compared to that in the prior art. As a result, the "0" data can be sufficiently written.

FIG. 9 is a circuit diagram illustrating an operation performed to write "1" data to the selected unit cell C0. To write "1" data, the voltage across the spare plate line SPL is reduced from the high voltage to the low voltage as shown in FIG. 10. The voltage across the spare plate line SPL is raised to the high potential.

The voltage across the spare plate line SPL is raised to the high potential and applied to the ferroelectric capacitor in the unit cell C0 via the three redundancy transistors. In the prior art, the potential across the spare plate line is applied to the selected cell via seven redundancy transistors. That is, the first embodiment applies the potential across the spare plate line SPL to the selected cell via fewer transistors than the prior art. Thus, even if the unit cells in the redundancy memory cell block have bad characteristics, specifically the redundancy cell transistors in the unit cells have increased on-resistance values, the potential across the spare plate line SPL is applied to the selected cell fast. Consequently, the potential across the spare plate line SPL rises faster, as shown by a solid line in FIG. 10, than in a conventional case shown by a broken line. This increases the time for which the write voltage is applied to the ferroelectric capacitor in the selected unit cell C0 compared to that in the prior art. As a result, the "1" data can be sufficiently written.

Thus, when data is written to the unit cell C0, located furthest from the spare plate line SPL, the potential across the spare plate line SPL is applied to the unit cell fast. This increases the time for which the write voltage is applied to the ferroelectric capacitor in the selected unit cell, resulting in a sufficient write operation.

Second Embodiment

Now, description will be given of a chain FeRAM in accordance with a second embodiment of the present invention. In the chain FeRAM in accordance with the first embodiment, described above, one unit cell is composed of one memory cell transistor and one ferroelectric capacitor. What is called a 1T1C operation is performed; 1-bit data is stored in one unit cell.

In contrast, in the chain FeRAM in accordance with the second embodiment, a pair of bit lines BL and /BL and a pair of plate lines PL and /PL are provided. In this chain FeRAM, one memory cell transistor and one ferroelectric capacitor constitute one unit cell. What is called a 2T2C operation is performed; 1-bit data is stored using two unit cells.

Figure 11:
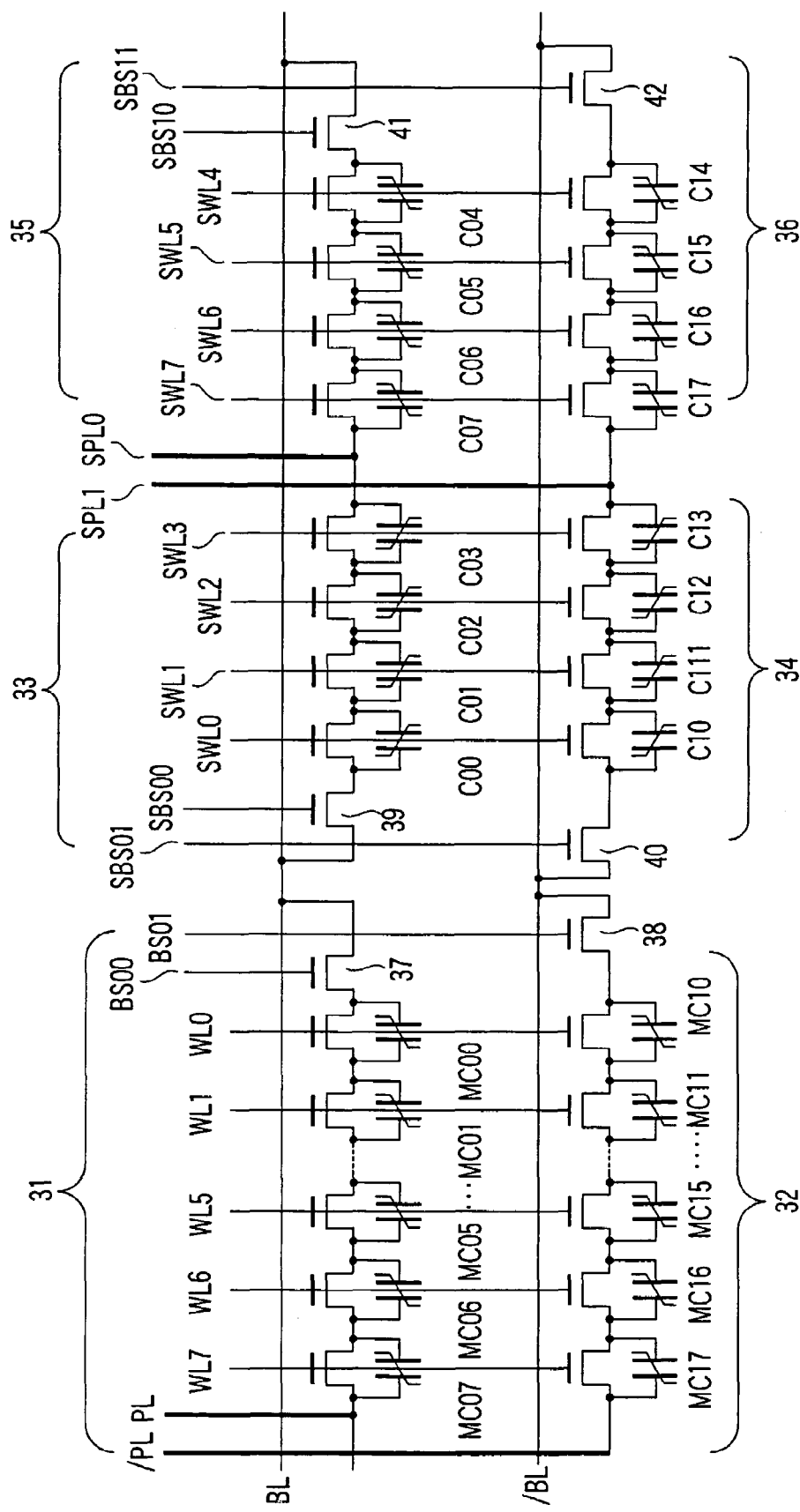
FIG. 11 is a circuit diagram showing a detailed configuration of a part of a chain FeRAM in accordance with a second embodiment.

FIG. 11 shows a detailed configuration of the chain FeRAM that performs what is called a 2T2C operation; the figure shows two memory cell blocks 31 and 32 in the memory cell array 11 in FIG. 1 which are located closest to the row redundancy array 13, two redundancy memory cell blocks 33 and 34 in the first row redundancy array 13a, and two redundancy memory cell blocks 35 and 36 in the second row redundancy array 13b. In an actual chip, a large number of memory cell blocks are arranged to the left of each of the memory cell blocks 31 and 32 but are not shown in FIG. 11.

The memory cell block 31 contains n, for example, eight unit cells MC00 to MC07 connected in series. Each of the unit cells is composed of a memory cell transistor having a source and a drain and a ferroelectric capacitor connected in parallel between the source and drain of the memory cell transistor. One end of the memory cell block 31 is connected to a bit line BL via a block selecting transistor 37. The other end is connected to a plate line PL.

The memory cell block 32 contains n, for example, eight unit cells MC10 to MC17 connected in series. Each of the unit cells is composed of a memory cell transistor having a source and a drain and a ferroelectric capacitor connected in parallel between the source and drain of the memory cell transistor. One end of the memory cell block 32 is connected to a bit line /BL via a block selecting transistor 38. The other end is connected to a plate line /PL.

The redundancy memory cell block 33 contains (n/2), for example, four spare unit cells C00 to C03 connected in series. Each of the spare unit cells is composed of a redundancy cell transistor having a source and a drain and a ferroelectric capacitor connected in parallel between the source and drain of the redundancy cell transistor. One end of the redundancy memory cell block 33 is connected to the bit line BL via a block selecting transistor 39. The other end is connected to a spare plate line SPL0.

The redundancy memory cell block 34 contains (n/2), for example, four spare unit cells C10 to C13 connected in series. Each of the spare unit cells is composed of a redundancy cell transistor having a source and a drain and a ferroelectric capacitor connected in parallel between the source and drain of the redundancy cell transistor. One end of the redundancy memory cell block 34 is connected to the bit line /BL via a block selecting transistor 40. The other end is connected to a spare plate line SPL1.

The redundancy memory cell block 35 contains four spare unit cells C04 to C07 connected in series. Each of the spare unit cells is composed of a redundancy cell transistor having a source and a drain and a ferroelectric capacitor connected in parallel between the source and drain of the redundancy cell transistor. One end of the redundancy memory cell block 35 is connected to the bit line BL via a block selecting transistor 41. The other end is connected to the spare plate line SPL0.

The redundancy memory cell block 36 contains four spare unit cells C14 to C17 connected in series. Each of the spare unit cells is composed of a redundancy cell transistor having a source and a drain and a ferroelectric capacitor connected in parallel between the source and drain of the redundancy cell transistor. One end of the redundancy memory cell block 36 is connected to the bit line /BL via a block selecting transistor 42. The other end is connected to the spare plate line SPL1.

That is, the redundancy memory cell block 33 or 35 contains the spare unit cells C00 to C03 or C04 to C07, the number of which is smaller than that of the unit cells in the memory cell block 31. Each of the spare unit cells in the redundancy memory cell block 33 or 35 is composed of the redundancy cell transistor having the source and the drain and the ferroelectric capacitor connected in parallel between the source and drain of the redundancy cell transistor. Moreover, the redundancy memory cell block 34 or 36 contains the spare unit cells C10 to C13 or C14 to C17, the number of which is smaller than that of the unit cells in the memory cell block 32. Each of the spare unit cells in the redundancy memory cell block 34 or 36 is composed of the redundancy cell transistor having the source and the drain and the ferroelectric capacitor connected in parallel between the source and drain of the redundancy cell transistor.

In the memory cell blocks 31 and 32, n, in the present example, eight word lines WL0 to WL7 are extended across the rows. The eight word lines WL0 to WL7 are each connected to gate electrodes of two corresponding cell transistors each contained in one of the eight unit cells MC00 to MC07 in the memory cell block 31 or one of the eight unit cells MC10 to MC17 in the memory cell block 32. Moreover, in the memory cell blocks 31 and 32, two block selecting line BS00 and BS01 are extended across the rows. One BS00 of the block selecting lines is connected to a gate electrode of the block selecting transistor 37. The other block selecting line BS01 is connected to a gate electrode of the block selecting transistor 38.

In the redundancy memory cell blocks 33 and 34, (n/2), in the present example, four word lines SWL0 to SWL3 are extended across the rows. The four word lines SWL0 to SWL4 are each connected to gate electrodes of two corresponding cell transistors each contained in one of the four unit cells C00 to C03 in the memory cell block 33 or one of the four unit cells C10 to C13 in the memory cell block 34. Moreover, in the memory cell blocks 33 and 34, two block selecting line SBS00 and SBS01 are extended across the rows. One SBS00 of the block selecting lines is connected to a gate electrode of the block selecting transistor 39. The other block selecting line SBS01 is connected to a gate electrode of the block selecting transistor 40.

In the redundancy memory cell blocks 35 and 36, (n/2), in the present example, four word lines SWL4 to SWL7 are extended across the rows. The four word lines SWL4 to SWL7 are each connected to gate electrodes of two corresponding cell transistors each contained in one of the four unit cells C04 to C07 in the memory cell block 35 or one of the four unit cells C14 to C17 in the memory cell block 36. Moreover, in the memory cell blocks 35 and 36, two block selecting line SBS10 and SBS11 are extended across the rows. One SBS10 of the block selecting lines is connected to a gate electrode of the block selecting transistor 41. The other block selecting line SBS11 is connected to a gate electrode of the block selecting transistor 42.

In the chain FeRAM configured as described above, during a data access, two unit cells are selected which are connected to a common word line and each of which is contained in one of the memory cell blocks 31 and 32. During a data read operation, a pair of different data pre-stored in the two selected cells is read to the pair of bit lines BL and /BL. During a data write operation, different potentials are supplied to the pair of bit lines and the pair of plate lines connected to the memory cell blocks 31 and 32. Thus, the different data are written to the two selected cells.

If any of the unit cells in the memory cell block 31 is defected, the memory cell block 31 is replaced with the redundancy memory cell block 33 or 35, each consisting of four unit cells. If any of the unit cells in the memory cell block 32 is defected, the memory cell block 32 is replaced with the redundancy memory cell block 34 or 36, each consisting of four unit cells.

In this case, in the redundancy memory cell block 33 or 35 and the redundancy memory cell block 34 or 36, the number of unit cells connected in series is half that in the memory cell block 31 or 32. Thus, as in the case with the chain FeRAM in accordance with the first embodiment, when any memory cell block is replaced with an appropriate redundancy memory cell block, the redundancy memory cell block enables data to be read faster and written more sufficiently than in the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric random access memory comprising:
    a memory cell block which includes a plurality of unit cells connected in series and each composed of a memory cell transistor having a source and a drain and a ferroelectric storage element connected in parallel between the source and drain of the memory cell transistor, the memory cell block being connected between a bit line and a plate line via a block selecting transistor; and
    a redundancy memory cell block which includes a plurality of unit cells the number of which is smaller than that of the unit cells in the memory cell block, the unit cells being connected in series and each composed of a redundancy cell transistor having a source and a drain and a ferroelectric storage element connected in parallel between the source and drain of the redundancy cell transistor, the redundancy memory cell block being connected between the bit line and a spare plate line via a spare block selecting transistor, the redundancy memory cell block being used in place of the memory cell block when any of the unit cells in the memory cell block is defected.

2. A ferroelectric random access memory according to claim 1, wherein the memory cell block has n (a positive integer) unit cells, and each of the redundancy memory cell blocks has (n/2) unit cells.

3. A ferroelectric random access memory according to claim 2, wherein the n is eight.

4. A ferroelectric random access memory according to claim 1, wherein the redundancy memory cell block is a row redundancy memory cell block.

5. A ferroelectric random access memory according to claim 4, further comprising:
    a plurality of word lines connected to gate electrodes in the plurality of memory cell transistors in the memory cell block; and
    a plurality of spare word lines connected to gate electrodes in the plurality of redundancy memory cell transistors in the redundancy memory cell block.

6. A ferroelectric random access memory according to claim 5, wherein the number of the spare word lines is half that of the word lines.

7. A ferroelectric random access memory according to claim 4, wherein the redundancy memory cell block has two types of redundancy memory cell blocks comprising:
    a first redundancy memory cell block which includes a plurality of memory cells the number of which is smaller than that of the unit cells in the memory cell block, the memory cells being connected in series and each composed of a redundancy cell transistor having a source and a drain and a ferroelectric storage element connected in parallel between the source and drain of the redundancy cell transistor, the first redundancy memory cell block being connected between the bit line and the spare plate line via a first spare block selecting transistor, the first redundancy memory cell block being used in place of the memory cell block when any of the unit cells in the memory cell block is defected; and
    a second redundancy memory cell block which includes a plurality of memory cells the number of which is smaller than that of the unit cells in the memory cell block, the memory cells being connected in series and each composed of a redundancy cell transistor having a source and a drain and a ferroelectric storage element connected in parallel between the source and drain of the redundancy cell transistor, the second redundancy memory cell block being connected between the bit line and the spare plate line via a second spare block selecting transistor, the second redundancy memory cell block being used in place of the memory cell block when any of the unit cells in the memory cell block is defected.

8. A ferroelectric random access memory according to claim 7, wherein one end of the first redundancy memory cell block is connected to the bit line via the first spare block selecting transistor, and the other end of the first redundancy memory cell block is connected to the spare plate line, and
    one end of the second redundancy memory cell block is connected to the bit line via the second spare block selecting transistor, and the other end of the second redundancy memory cell block is connected to the spare plate line.

9. A ferroelectric random access memory according to claim 7, wherein the memory cell block has n (a positive integer) unit cells, and each of the redundancy memory cell blocks has (n/2) unit cells.

10. A ferroelectric random access memory according to claim 9, wherein the n is eight.

11. A ferroelectric random access memory according to claim 7, further comprising:
    a plurality of word lines connected to gate electrodes in the plurality of memory cell transistors in the memory cell block; and
    a plurality of first spare word lines connected to gate electrodes in the plurality of redundancy memory cell transistors in the first redundancy memory cell block; and
    a plurality of second spare word lines connected to gate electrodes in the plurality of redundancy memory cell transistors in the second redundancy memory cell block.

12. A ferroelectric random access memory according to claim 11, wherein the number of each of the first and second spare word lines is half that of the word lines.

13. A ferroelectric random access memory comprising:
a first memory cell block which includes a plurality of unit cells connected in series and each composed of a memory cell transistor having a source and a drain and a ferroelectric storage element connected in parallel between the source and drain of the memory cell transistor, the first memory cell block being connected between a first bit line and a first plate line via a first block selecting transistor;
a second memory cell block which includes a plurality of unit cells connected in series and each composed of a memory cell transistor having a source and a drain and a ferroelectric storage element connected in parallel between the source and drain of the memory cell transistor, the second memory cell block being connected between a second bit line and a second plate line via a second block selecting transistor;
a first redundancy memory cell block which includes a plurality of unit cells the number of which is smaller than that of the unit cells in the first memory cell block, the unit cells being connected in series and each composed of a redundancy cell transistor having a source and a drain and a ferroelectric storage element connected in parallel between the source and drain of the redundancy cell transistor, the first redundancy memory cell block being connected between the first bit line and a first spare plate line via a first spare block selecting transistor, the first redundancy memory cell block being used in place of the first memory cell block when any of the unit cells in the first memory cell block is defected; and
a second redundancy memory cell block which includes a plurality of unit cells the number of which is smaller than that of the unit cells in the second memory cell block, the unit cells being connected in series and each composed of a redundancy cell transistor having a source and a drain and a ferroelectric storage element connected in parallel between the source and drain of the redundancy cell transistor, the second redundancy memory cell block being connected between the second bit line and a second spare plate line via a second spare block selecting transistor, the second redundancy memory cell block being used in place of the second memory cell block when any of the unit cells in the second memory cell block is defected.

14. A ferroelectric random access memory according to claim 13, wherein in the first and second memory cell blocks, n (a positive integer) unit cells are connected in series, and in the first and second redundancy memory cell blocks, (n/2) unit cells are connected in series.

15. A ferroelectric random access memory according to claim 14, wherein the n is eight.

16. A ferroelectric random access memory according to claim 13, further comprising:
a plurality of word lines each connected to gate electrodes in a corresponding one of the plurality of memory cell transistors in the first memory cell block and in a corresponding one of the plurality of memory cell transistors in the second memory cell block; and
a plurality of spare word lines each connected to gate electrodes in a corresponding one of the plurality of redundancy cell transistors in the first redundancy memory cell block and in a corresponding one of the plurality of redundancy cell transistors in the second redundancy cell block.

17. A ferroelectric random access memory according to claim 16, wherein the number of the spare word lines is half that of the word lines.

18. A ferroelectric random access memory according to claim 13, further comprising:
a third redundancy memory cell block which includes a plurality of unit cells the number of which is smaller than that of the unit cells in the first memory cell block, the unit cells being connected in series and each composed of a redundancy cell transistor having a source and a drain and a ferroelectric storage element connected in parallel between the source and drain of the redundancy cell transistor, the third redundancy memory cell block being connected between the first bit line and the first spare plate line via a third spare block selecting transistor, the third redundancy memory cell block being used in place of the first memory cell block when any of the unit cells in the first memory cell block is defected; and
a fourth redundancy memory cell block which includes a plurality of unit cells the number of which is smaller than that of the unit cells in the second memory cell block, the unit cells being connected in series and each composed of a redundancy cell transistor having a source and a drain and a ferroelectric storage element connected in parallel between the source and drain of the redundancy cell transistor, the fourth redundancy memory cell block being connected between the second bit line and the second spare plate line via a fourth spare block selecting transistor, the fourth redundancy memory cell block being used in place of the second memory cell block when any of the unit cells in the second memory cell block is defected.

19. A ferroelectric random access memory according to claim 18, wherein in the first and second memory cell blocks, n (a positive integer) unit cells are connected in series, and in the first, second, third, and fourth redundancy memory cell blocks, (n/2) unit cells are connected in series.

20. A ferroelectric random access memory according to claim 18, wherein one end of the first redundancy memory cell block is connected to the first bit line via the first spare block selecting transistor, and the other end of the first redundancy memory cell block is connected to the first spare plate line,
one end of the second redundancy memory cell block is connected to the second bit line via the second spare block selecting transistor, and the other end of the second redundancy memory cell block is connected to the second spare plate line,
one end of the third redundancy memory cell block is connected to the first bit line via the third spare block selecting transistor, and the other end of the third redundancy memory cell block is connected to the first spare plate line, and
one end of the fourth redundancy memory cell block is connected to the second bit line via the fourth spare block selecting transistor, and the other end of the fourth redundancy memory cell block is connected to the second spare plate line.

* * * * *